United States Patent [19]
Baker et al.

[11] Patent Number: 5,675,286
[45] Date of Patent: Oct. 7, 1997

[54] METHOD AND APPARATUS FOR AN IMPROVED LINEAR TRANSMITTER

[75] Inventors: Michael H. Baker, Elmhurst; Paul H. Gailus, Prospect Heights; William J. Turney; Lawrence F. Cygan, both of Schaumburg, all of Ill.

[73] Assignee: Motorola, Inc., Schaumburg, Ill.

[21] Appl. No.: 599,656

[22] Filed: Feb. 12, 1996

[51] Int. Cl.⁶ ........................................... H03G 3/30
[52] U.S. Cl. .................... 330/129; 330/149; 330/279; 455/126
[58] Field of Search ........................ 330/129, 136, 330/138, 149, 279, 281; 325/296, 297; 455/116, 126

[56] References Cited

U.S. PATENT DOCUMENTS

| | | |
|---|---|---|
| 4,933,986 | 6/1990 | Leitch . |
| 5,021,253 | 6/1991 | Chapman .................. 455/126 X |
| 5,066,923 | 11/1991 | Gailus et al. . |
| 5,175,879 | 12/1992 | Ellingson et al. . |
| 5,384,547 | 1/1995 | Lynk, Jr. et al. .............. 330/138 X |
| 5,426,641 | 6/1995 | Afrashteh et al. .............. 330/279 X |
| 5,559,807 | 9/1996 | van den Heuvel et al. ........ 375/297 X |
| 5,564,087 | 10/1996 | Cygan et al. .................. 455/126 |

*Primary Examiner*—James B. Mullins
*Attorney, Agent, or Firm*—M. Mansour Ghomeshi

[57] ABSTRACT

An amplifier structure (200) includes a main amplifier loop (203) for efficiently amplifying an input signal at a power amplifier (228) coupled to a load susceptible to impedance variations. The amplifier loop (200) further includes an auxiliary loop (201) coupled to the main loop (201) for simultaneously preventing the power amplifier (228) from operating inefficiently or causing off-channel interference.

12 Claims, 4 Drawing Sheets

FIG.1
(PRIOR ART)

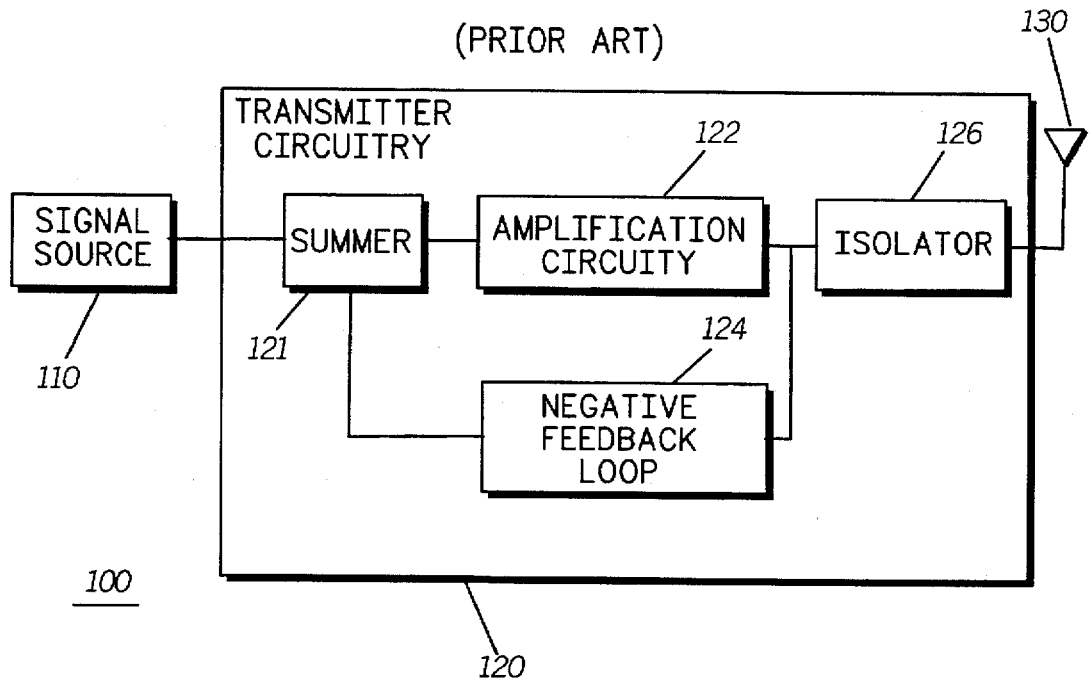

FIG.5

| I,Q DC CORRECTION PULSE OUTPUTS | QUADRANT 1 | QUADRANT 2 | QUADRANT 3 | QUADRANT 4 |
|---|---|---|---|---|
| DecreaseI DecreaseQ | Increase attenuation | | Decrease attenuation | |
| DecreaseI DecreaseQ | | Decrease phase | | Increase phase |
| IncreaseI DecreaseQ | | Increase attenuation | | Decrease attenuation |
| IncreaseI DecreaseQ | Increase phase | | Decrease phase | |
| DecreaseI IncreaseQ | | Decrease attenuation | | Increase attenuation |
| DecreaseI IncreaseQ | Decrease phase | | Increase phase | |
| IncreaseI IncreaseQ | Decrease attenuation | | Increase attenuation | |
| IncreaseI IncreaseQ | | Increase phase | | Decrease phase |

500

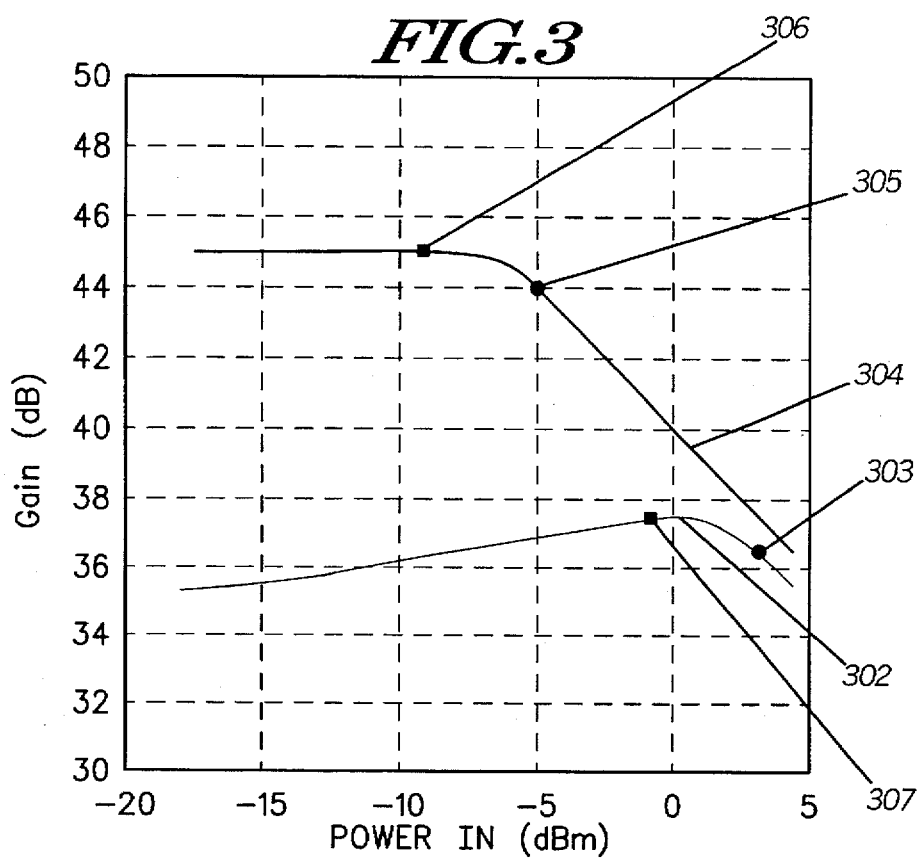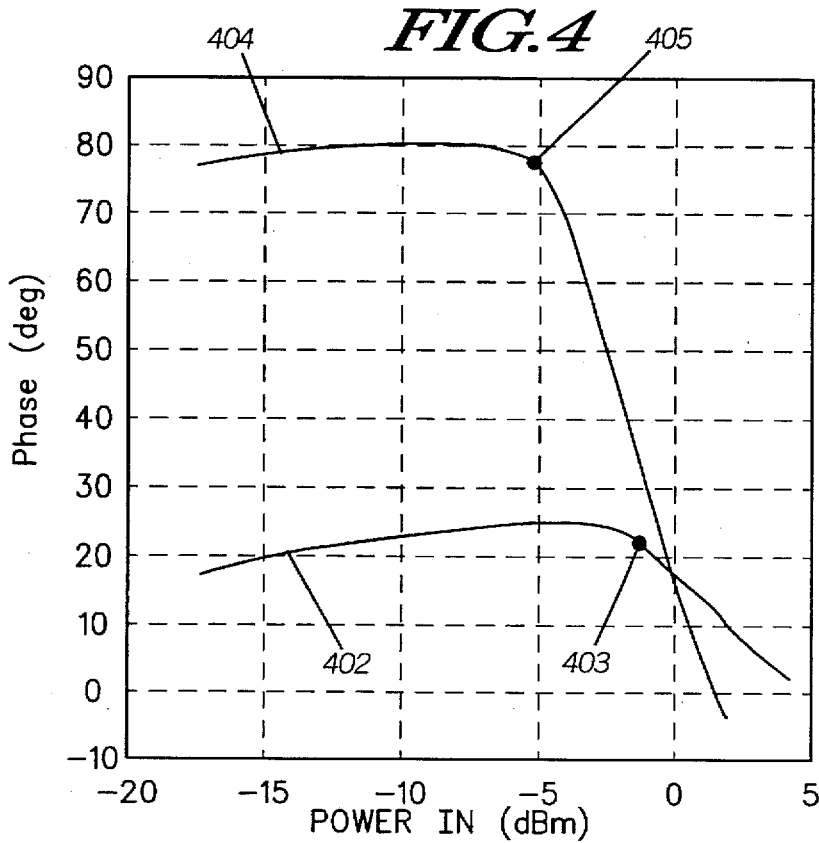

METHOD AND APPARATUS FOR AN IMPROVED LINEAR TRANSMITTER

FIELD OF THE INVENTION

This invention is generally related to amplifiers and more particularly to linear amplifiers.

BACKGROUND OF THE INVENTION

Radio communication devices use antennas to provide for the efficient transmission of radio frequency communication signals. The transmitter portion of a communication device includes a power amplifier to amplify the radio frequency signals before they are coupled to the antenna for transmission. The power amplifier design often relies upon a constant load impedance in maximizing gain, efficiency, power output level, and other like parameters. The behavior of a transmitter may be affected by its operating environment. For example, a transmitter operating near an electromagnetically reflective structure may be susceptible to energy reflected back through the antenna into the transmitter. Reflective energy may be detrimental to transmitter performance, particularly to the performance of the power amplifier.

To protect against changes in load impedance as a result of reflected energy, an isolator or circulator is often inserted between the antenna and the power amplifier. The isolator protects the power amplifier by absorbing the reflected energy and preventing it from reaching the amplifier. The isolator directs the reflected energy to an absorptive load termination. Although the isolator generally works well, it adds significant cost, size, and weight to the design of a radio communication device. The size of the isolator is particularly prohibitive in low frequency applications where it may reach several cubic inches in size.

Another prior art solution to the problem of reflected energy incorporates a directional coupler to detect the reflected energy and provides a means of adjusting the gain of the power amplifier accordingly. Generally, to minimize the potential of damage to the power amplifier, the gain to the power amplifier is reduced when high levels of reflected energy are present. With this approach, the circuitry for detection of the reflected energy must operate at the transmission frequency. This adds significant cost and complexity to the radio design.

FIG. 1 is a block diagram showing a prior art linear transmitter 100. Linear transmitters, which are typically used in quadrature amplitude modulation (QAM), must provide a predictable response in order to reliably transmit complex base band signals. In the linear transmitter 100, a signal source 110 provides a complex baseband signal to transmitter circuitry 120. Amplification circuitry 122 amplifies the signal for transmission through an antenna 130. As is typical in the prior art, a feedback signal from a negative feedback correction loop 124 is combined with the source signal in a summer 121. The feedback loop is used to improve the linearity of the power amplifier. In so doing, the level of energy transmitted on adjacent channel frequencies, known as splatter, is reduced. Such adjacent channel energy may be disruptive to communication in progress on these channels, hence the need for negative feedback correction. Further included in the prior art transmitter 100 is an isolator 126 situated between the antenna 130 and the remaining transmitter circuitry.

The isolator presents a constant load impedance to the power amplifier irrespective of the impedance presented to the isolator by the antenna. The use of the isolator thereby avoids unpredictable variations in power amplifier gain and phase characteristics which would occur if the antenna were connected directly to the power amplifier. Those skilled in the art will understand that a varying load impedance will cause the power amplifier gain to change, thus altering the effectiveness of the feedback correction loop. Such load variations may also result in phase changes within the power amplifier which may make the feedback loop unstable. Unstable operation may result in severe interference to other communication services and/or the destruction of the linear transmitter. Thus, the isolator protects the power amplifier from load impedance changes and associated reflected energy from the antenna 130 during the transmission.

It is desirable to provide a linear transmitter while avoiding the cost, size, and weight issues associated with isolators. Such linear transmitters must be capable of rapidly adjusting to changes in operating environment to maintain a stable and linear response while maintaining the efficiency of the power amplifier.

BRIEF DESCRIPTION OF THE DRAWINGS

FIG. 1 is a block diagram showing a prior art linear amplifier.

FIG. 3 shows gain performance graphs of a linear transmitter in accordance with the present invention.

FIG. 4 shows phase performance graphs of a linear transmitter in accordance with the present invention.

FIG. 5 shows a DC correction table in accordance with the present invention.

DETAILED DESCRIPTION OF THE PREFERRED EMBODIMENT

Figure 2:
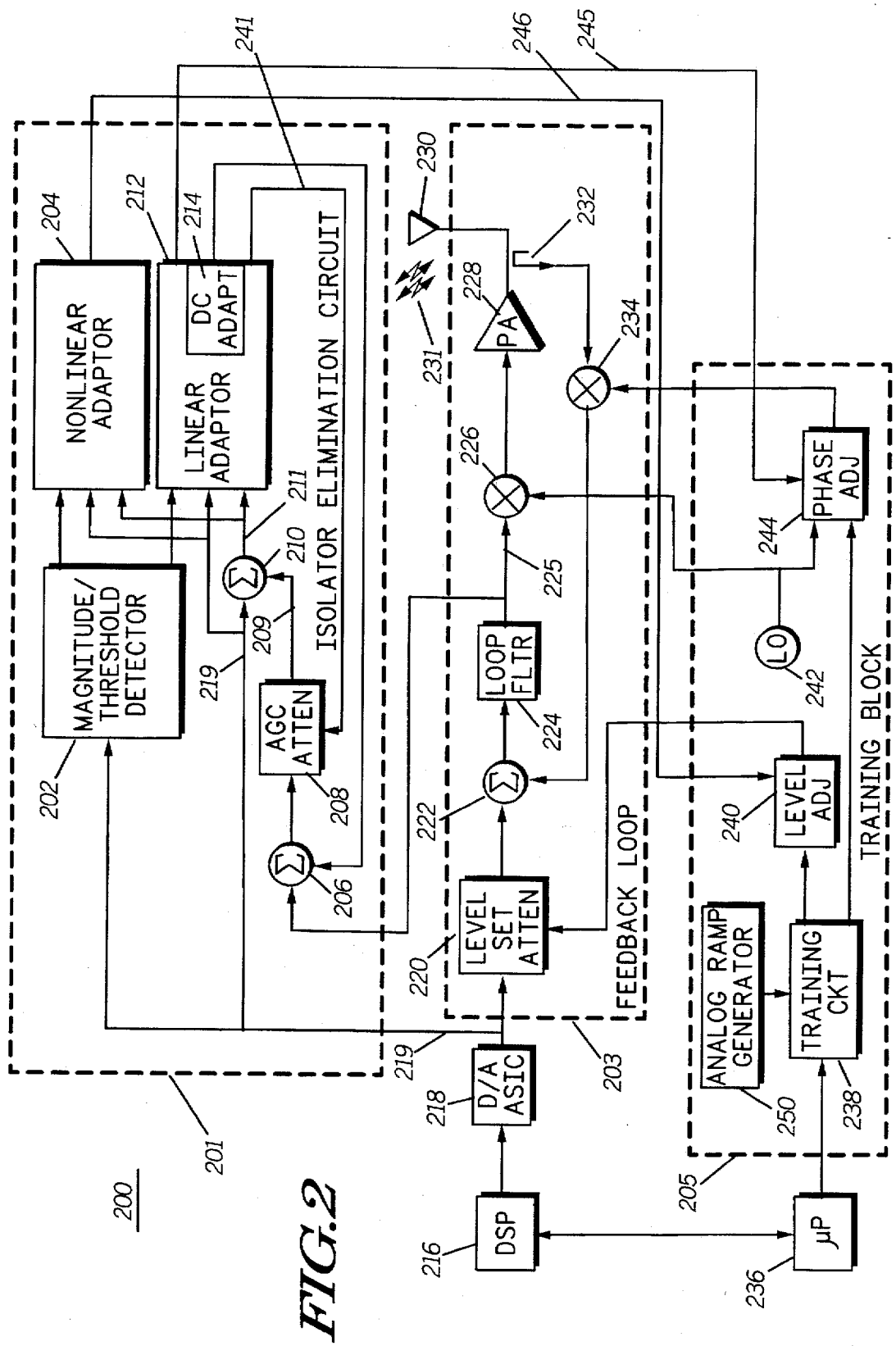
FIG. 2 is a linear transmitter in accordance with the present invention.

Power amplifiers used in communication devices are designed for optimal operation with a fixed impedance. However, the impedance of an antenna coupled to the power amplifier changes when the antenna is in close proximity of reflective or absorptive objects. An isolator is used in between the power amplifier and the antenna to minimize the effect of load changes on the power amplifier. The weight and size of isolators significantly limit their desirability in today's smaller portable products. The present invention provides for the elimination of the isolator by continuously tracking and correcting loop gain, phase, and level set changes. In accordance with the present invention, performance degradation of the transmitter in the presence of antenna interference is minimized by employing two adaptive algorithms which work in conjunction with each other to minimize the difference between the input signal and a signal in the transmitter loop. The first adapter removes the linear gain and phase errors. The second sets a desired operating point for the amplifier. The operation of the present invention proceeds without the need for external training signals, and is compatible with continuous time systems as well as TDMA (Time Division Multiple Access) systems.

The principles of the present invention will be better understood by referring to the following description presented in conjunction with a series of drawings where like reference numerals are carried forward.

Referring to FIG. 2, a block diagram of a radio frequency amplifier as part of a linear transmitter 200 in accordance with the present invention is shown. This amplifier may be integrated individually or along with other components of the linear transmitter 200 to produce an integrated circuit suitable for today's cost and space conscious communication devices. A digital signal processor (DSP) 216 represents a signal source. The signal sourced by this processor 216 is converted to analog via a Digital to Analog Converter (D/A) 218 to produce a signal 219. This signal 219 is the input signal to an radio frequency amplifier feedback loop 203 and an isolator elimination circuit 201. The amplifier feedback loop 203 and the isolator elimination circuit 201 establish the main amplifier loop and the auxiliary loop of the present invention, respectively. The amplifier feedback loop is a closed loop amplifier structure and preferably a Cartesian feedback loop amplifier. The input signal is a complex digital baseband signal having quadrature components, i.e. In-phase (I) and Quadrature (Q) components. At the feedback loop 203 the input signal is coupled to a level set attenuator 220. The attenuator 220 provides a modulated reference signal which is coupled to a summing junction 222. The summer 222 combines this reference signal to a signal fed back from the output of the loop 203 to provide an error signal as input to a loop filter 224. The filtered error signal 225 is up-converted at a mixer 226 to radio frequency (RF) to produce a drive signal. This drive signal is then applied to a Power Amplifier (PA) 228 for amplification. The amplified signal is transmitted via an antenna 230 to produce transmit signal 231. This antenna 230 forms the load, which is susceptible to impedance variations, for the power amplifier 228. A sample of the amplified signal is fed back to the summer 222 via a coupler 232 and a down-converter at mixer 234. The filtered error signal 225 is also coupled to a summing junction 206 where it is combined with the output signal from a DC adapter 214. The error signal at the output of the summer 206 is applied to an AGC attenuator circuit 208. This circuit 208 constitutes the linear gain control circuit of the auxiliary loop. Under the direction of a linear adapter circuit 212, the attenuation through AGC attenuator 208 is adjusted, selectively altering the AGC signal 209 which is applied to a summing junction 210. At this junction 210 the signal 219 is summed to the output 209 of the AGC attenuation circuit 208 to produce an error signal 211. This error signal 211 is applied to both adapter circuits 204 and 212. The outputs, 245 and 246, from these adapters 204 and 212 are fed back to circuits in the training block 205 to form an auxiliary loop capable of controlling the operation of the PA 228 both in the linear and non-linear mode for best performance.

In the preferred embodiment, initial level set adjustment for the attenuator 220 and phase shift adjustment for mixer 234 are provided by the training loop 205. After the transmitter 200 powers up, the training circuitry 205 injects external signals into the main loop 203 and does an initialization train. The initialization train sets feedback loop phase to avoid unstable operation. The initialization train also adjusts level set attenuator 220 to a value which avoids overdriving power amplifier 228. Both of these actions avoid adjacent channel interference. Upon completion of the initialization train, the isolator elimination circuit 201 through the auxiliary loop takes over the job of adjusting loop phase and level setting, hence making continuous transmission possible.

The training block 205 includes a training circuit 238 which is in communication with the DSP 216 via a microprocessor 236. The training circuit 238 works in conjunction with analog ramp generator 250 and signals generated by the DSP 216 to accomplish level set adjustments at a level adjust circuit 240 and phase adjustments at a phase adjust circuit 244.

The level set adjust circuit 240 disconnects the DSP 216 from the forward path and connects an analog ramp generator 250. The ramp generator 250 then starts ramping up its output linearly resulting in a corresponding ramping of the transmitter's RF output. The level adjust 240 continues increasing the ramp until a clip threshold is exceeded at the loop summer 222. At clip detection, the voltage at the ramp generator circuit 250 is sampled and held. The ramp output is then allowed to decay. While this is occurring, the DSP 216 sends a DC signal of maximum signal amplitude. Within the level set circuit, the sampled ramp signal and the maximum DSP signal are compared. A successive approximation routine (SAR) adjusts the level set attenuator until these two signals have identical values. When this process is completed, a constant attenuation level is added to the level set attenuator. The final level set attenuator value is such that modulation signal peaks drive the PA approximately 0.5 dB into gain compression—an optimal setting.

A local oscillator 242 provides a signal to the mixer 226 and the phase adjust 244. The phase adjust circuit 244 ensures that the transmit loop is stable. For the system to be stable, it is necessary that the loop provide negative feedback. The phase adjust circuit 244 opens the loop, injects signals and adjusts the phase of the two inputs of summer 222 until they are out of phase.

After opening the loop, a positive signal is sent on the I channel and no signal on the Q channel. If there is negative feedback; the feedback signal would be a negative signal on the I channel and no signal on the Q channel. The angle (on the I-Q plane) can be adjusted by adjusting the phase of the LO of the quadrature down-mixer 234. Phase is adjusted by using a successive approximation routine (SAR) to make increasingly finer adjustments to the phase of the LO to minimize the magnitude of the down-path Q channel.

In general, a training waveform is normally transmitted at the beginning of a transmission, but may also be transmitted during transmission depending upon the communication protocol. The training waveform provides a test signal for circuitry which adjusts modulation levels and loop phase. Proper adjustment of the attenuation setting of block 220 avoids power amplifier clipping, which is responsible for adjacent channel interference, otherwise known as splatter. Proper loop phase adjustment is necessary to prevent loop instability and also reduce adjacent channel splatter. A more detailed description of the training waveform methodology can be found in U.S. Pat. No. 5,066,923, issued to Gailus et al. on Nov. 19, 1991, titled Linear Transmitter Training Method and Apparatus, and assigned to Motorola, Inc.

The above training routine, solves the problem of optimally setting the level set attenuator 220 and loop phase shifter. However, this technique causes adjacent channel splatter and requires that the information to be transmitted be interrupted periodically so training waveforms can be sent through the transmitter. Interrupting the transmission for training is undesirable for systems that use continuous transmission (non-TDMA) such as CDMA and FDMA. To avoid this problem and in accordance with the present invention, this training is only used at initial power up of the transmitter 200. After power up, the linear adapter 212 and the nonlinear adapter 204 take over the training functions. These adapters use the DSP data as their input and thus enable the use of continuous transmission systems.

In addition to the adapters, the isolator elimination circuit 201 also contains a magnitude detector 202. A sample of the I and Q signals from the D/A 218 is coupled to a magnitude/ threshold detector 202 which utilizes a plurality of amplitude thresholds or signal windows to categorize the input signal in several groups; first, second, and third. The first signal or first time window corresponds to a medium input signal. The second signal or second time window corresponds to a big input signal, while the third time window is opened when a small input signal is present. Occurrences of these three signals produce time gates during which different activities take place in order to adapt the PA 228 input signals to the variations in the impedance presented thereto via the antenna 230. In other words, the presence of a large signal could be thought of having opened a time gate associated thereto. Similarly, time gates are opened when medium or small signals are detected. In the preferred embodiment, a big signal is defined to have occurred when the input signal is between 1 and 1.2 dB below its peak level. A medium range corresponds to input signals that are at least 15 dB below peak.

The time gate opened by a medium signal is used to establish performance parameters for the amplifier loop 203. The parameters include phase and amplitude which are calibrated during this window. The time gate opened by a big signal is used by the nonlinear adapter 204 to set the operation of the PA 228 in the nonlinear mode. In this mode, the operating point of the PA 228 is set for optimum performance. It is known that the efficiency of an amplifier is directly related to its operation in the nonlinear mode. Optimal efficiency is maintained, while the load varies, by adjusting the PA drive level to achieve a predetermined level of compression. The nonlinear adapter 204 accomplishes this objective utilizing the big signal time gate. The adapter 204 monitors signal compression and adjusts signal compression according to the level of the input signal. Time intervals defined by small signals are used to adjust the weights of adapter 204. Updates are performed during small signal intervals to avoid or minimize adjacent channel interference which would otherwise occur if adjustments were to take place during medium or big signals.

As stated, during the time gate opened by the presence of a big signal, the algorithm used in the nonlinear adapter 204 directs the level adjust 240 to alter the setting of the attenuator 220. The algorithm used in the nonlinear adapter 204 is similar to sign-sign least mean square (SSLMS). This is a reduced form of LMS that requires only the sign of the error and the sign of the input signal to estimate gain and phase. An example of the algorithm is given in the following paragraph.

Figure 6:
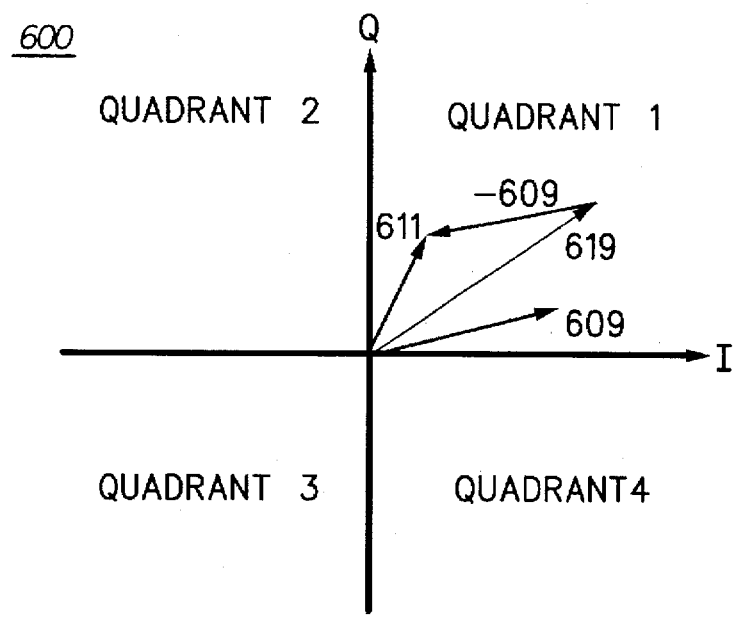
FIG. 6 shows a vector diagram in accordance with the present invention.

Referring to FIG. 6, a vector diagram 600 shows vectors 619, 609 and the resultant error vector 611 representing signals 219, 209, and 211, respectively. These vectors are all complex consisting of I and Q components. When adapters 212 and 214 have adjusted for optimal settings on DC, AGC and phase, the vectors 619 and 609 will be identical for medium signals. The vector diagram 600 shows the case where a detectable gain error exists between vectors 609 and 619. For a complex IQ signal, its sign can be broken down into the sign of its I channel and the sign of its Q channel. There are four combinations which can be represented by the four Euclidian quadrants as shown by the quadrants of the vector diagram 600. In the specific example under discussion here vectors 609 and 619 both lie in quadrant 1. Vectorally subtracting vector 609 from 619 results in the vector error signal 611.

Figure 7:
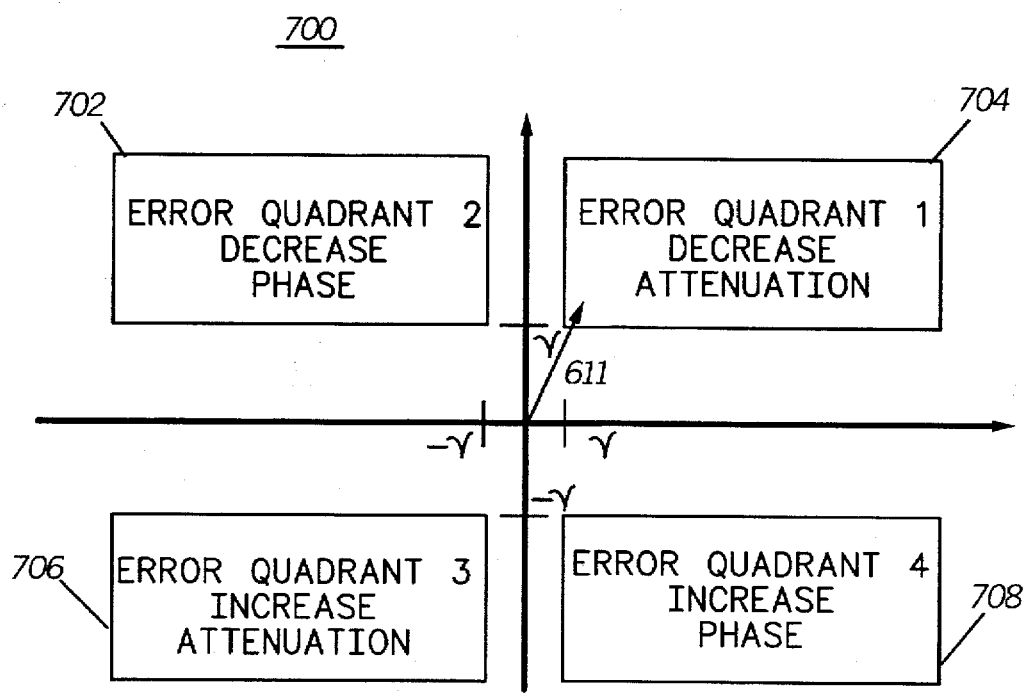
FIG. 7 shows an error signal on an IQ plot in accordance with the present invention.

The error signal's sign can also be represented by its quadrant. Referring to FIG. 7 the error signal 211 is shown plotted on an IQ plot 700 with thresholds 702–708 marking the regions of gain and phase errors. For the case described above, vector 609 was smaller than 619. This results in an error signal 611 that is in quadrant 1 and exceeds the I and Q detection thresholds. For inputs in quadrant 1 and errors in quadrant 1 exceeding the detection thresholds, the attenuation must be decreased to drive the error to zero. This region 704 is marked decrease attenuation. Regions 702, 706, and 708 are the detection regions for phase changes and increase attenuation based on the sign (quadrant) of the error signal. The plot 700 shows the fate of the error signal 211 which happens to fall in the region 704. Other vectors are treated according to the regions in which they occur. For the linear adapter 212, these thresholds are fixed levels. The goal of the linear adapter 212 is to drive the error signal created when medium signals are present to zero. The nonlinear adapter 204 uses the same gain and phase detectors as the linear adapter. However, the nonlinear adapter is used when big signals are present and forces a fixed amount of error at signal 211.

For the type of modulation used in the preferred embodiment the probability of signals in the medium region is much greater than the probability of signals in the big region. Thus, linear estimation and correction occurs much more often than level set (non-linear) correction. During the time gate opened by a medium signal, the linear adaptive algorithm holds the error signal between signals 209 and 219 near zero in the medium region. This zero error provides a reference for the entire system. When a big event occurs at the input signal 219, the algorithm can determine if the big signal caused gain compression, phase compression, phase expansion, gain expansion, or no error at the input of the mixer 226. The nonlinear adapter 204 adjusts the level of attenuation at the attenuator 220 to keep the transmitter output signal 231 near compression. The peak signals at 231 are preferably maintained at approximately 0.5 dB compression which is adequate to maintain some level of compression for enhanced efficiency without sacrificing a great deal of linearity.

It is significant to note that the nonlinear adapter 204 does not try to minimize its error input, as it is often the case in the approaches of the prior art. Instead, it tries to force a fixed error during big signals. If the error when a big signal is present is near zero, the power amplifier 228 is operating in too linear of a region which is not efficient. Under such a circumstance, the non-linear adapter 204 decreases the attenuation level imposed on signal 219 in order to increase the level of the signal applied to the PA 228. This action puts the peak signals near compression to provide for a more efficient operation.

The linear adapter 212 calibrates the amplitude and phase of the transmitter 200 using medium level signals. In other words, it establishes some performance parameters for the transmitter 200 and in turn gives a sense to the non-linear adapter 204 as to where the gain of the AGC 208 is with regard to a medium signal. Once calibrated, the magnitude detector 202 flags large signals and then compares them with the output of the AGC attenuator 208 to see if they are within a desired threshold. If not, the non-linear adapter 204 directs the level adjustment circuit 240 to alter the attenuator 220 to change the amplitude of the signal in order to move the output of the PA 228 to the desired area of the gain and phase curve knee. The prior art could not distinguish between low level gain variations in the PA and changes in the compression point of the PA. The prior art resulted in a suboptimal tradeoff between PA efficiency and adjacent channel interference.

To further illustrate the benefits of the parallel adapters 204 and 212 to the operation of the PA 228, reference is made to FIGS. 3 and 4 where the open loop performance of the PA 228 is monitored over a range of input power. FIG. 3 shows plots 302 and 304 of open loop gain versus input power for two different loads. Both loads are at a VSWR (Voltage Standing Wave Ratio) of 9:1 with different load angles. The 1 dB compression points are shown by 303 and 305 for curves 302 and 304, respectively. As the linear gain of the PA 228 decreases from curve 304 to 302, the signal 225 will get larger to maintain the same output at the PA 228. To compensate, the gain through the AGC 208 must decrease.

Those skilled in the art of negative feedback design will understand that the output of a negative feedback loop is proportional to the gain in the feedback path. The feedback loop compensates for gain changes in the forward path of the loop. The linear adapter is active during the medium region. When level set is optimally adjusted, the medium region will be the input level at the magnitude detector input 202 that corresponds to PA outputs that are 4 dB below the 0.5 dB compression point. As the PA's gain profile changes from curve 304 to 302, the PA's linear gain, as shown by 306 and 307, respectively, decreases from 45 dB to 37.3 dB for a total change of 7.7 dB. The term linear gain refers to the gain of the PA in the medium region where the PA is relatively linear.

The feedback loop compensates for the decrease in PA gain by increasing the signal at the PA's input. An increase in the input to the PA causes an equal signal increase in the path containing the AGC attenuator. The signal 225 will get larger causing an error at the summer output signal 211. The linear adapter monitors the signal 211 and attempts to keep this error signal zero for medium signals. To compensate for the reduction in the linear gain of the PA 228, the gain through the AGC 208 must decrease. However, the compression point of the PA 228 occurs at a higher PA output power. If, now, a big event occurs in the signal 219, the error signal 225 will have less compression error than desired. The gain of the level set attenuator 220 must increase 7.5 dB to drive the PA output signal to the optimal compression point. But, the gain of the AGC path is in series with the gain of the level set attenuator. Increasing the latter requires that the AGC be decreased to maintain a zero error on medium signals. The total change after the algorithm stabilizes in accordance with the present invention is a 7.7 dB increase in gain of the level set attenuator 220 and a 15.2 dB decrease in the AGC 208.

This aspect of the present invention is highly significant as the prior art did not separate linear and nonlinear gain, but instead measured the average gain change between the input signal 219 and the loop signal 225. For the above example, the average gain decreases approximately 7.5 dB from curve 304 to curve 302 when operating at 1 dB compression. The prior art would, therefore, try to decrease the level set gain by 7.5 dB resulting in low power, inefficient operation of the PA 228. By separating the two gains, the present invention adapts the operation of the transmitter path 200 to the changes in the impedance of the antenna 230 while maintaining the efficiency of the PA 228.

In some instances a particular load may force a significant phase change before gain compression is realized. Since phase change as a result of compression during big signals also causes adjacent channel splatter, a successful algorithm must be able to accommodate both for phase change and gain non-linearities. The algorithm of the present invention assumes that phase differences between the linear and non-linear adapters are caused by overdriving the power amplifier. In accordance with the present invention, the transmitter 200 monitors both the gain non-linearities and the phase change and adjusts the level set attenuator accordingly to maintain a fixed error at the output of summer 210. The fixed error is composed of a sum of errors due to both gain non-linearities and phase change when big signals are present. This is documented in FIG. 4 where curves 404 and 402 show the variation of the PA open loop phase over changes in input power at two different loads. Once again, both loads produce a VSWR of 9:1. These curves include 3.2 degree phase change shown by points 403 and 405. Once again, it can be seen that adapters 204 and 212 maintain a desired compression with varying loads. It is noted that phase change of 3.2 degrees with no gain error gives approximately the same level of error as gain compression of 0.5 dB with no phase error.

In general, a normal adaptive gradient search depends on having a linear loop. The gain of the transmitter 200 can change by 1 dB versus input power in the region from 4 to 20 dB below peak. This is close enough to linear for an adaptive gradient search to do quiet well. However, as the weights approach convergence, the misadjustment noise due to the weak non-linearities dominates. This weight jitter limits the accuracy of the nonlinear adapter 204. By narrowing the range of the magnitude of the input signal 219 used for adaptation, one can trade adaptation rate for misadjustment noise.

A second advantage results from narrowing the range of the magnitude detector. The sign-sign adaptive algorithm of the prior art generally can not estimate when there is interference or how large an interference it is once it has been detected. Indeed, it can be shown that when the input signal is very small that the weights in a sign-sign LMS algorithm can diverge. This situation is referred to as insufficient excitation of the adapter. The present invention overcomes this problem by limiting estimation of gain and phase errors to times when the input signal is large, hence the SSLMS algorithm has sufficient stimulus at all times. By fixing the amplitude of the input signal 219 to a narrow range of larger linear signals in the gradient search, the present invention reduces misadjustment noise and provides for an enhanced accuracy in gain and phase. This additional accuracy is desired in order to effectively eliminate the isolator of the prior art and still maintain a high degree of responsiveness to changes in the reflected energy from the antenna 230 to the PA 228.

As a result, neither the efficiency nor the linearity of the amplifier 228 is compromised when the impedance of the antenna 230 changes as its surrounding environment changes. This is accomplished without using an isolator which is getting to be too bulky and expensive for today's volume and cost efficient communication devices.

In another aspect of the present invention, misadjustment noise which results from DC offsets between the transmitter input signal 219 and the transmitter forward path point 225 is eliminated. This is a significant benefit of the present invention as presently available adapters do not solve this significant concern. In general, baseband DC offsets are available at the signal point 225. Since a sample of this signal is coupled to the auxiliary loop 201, attempts must be made to minimize the effect of these DC offsets on the performance of the transmitter 200. In general, these DC offsets are small enough that their effect on the accuracy of the adapters 204 and 212 is virtually unnoticeable when the errors caused by the antenna environment are large. However, as the adapters compensate for the effects of the environment on the antenna 230, the adaptive weights approach steady state. With the weights near steady state, the gain and phase detectors inside the linear adapter 212 and the nonlinear adapter 204 become very sensitive to the DC offsets between the signals 219 and 209. When DC differences between these two points 219 and 209 exceed the error threshold windows, the gain and phase detectors inside the linear adapter 204 begins falsing on the gain and phase correction lines 241 and 245, respectively. This falsing is symmetrical in the IQ plane so it does not significantly decrease the tracking accuracy. However, the falsing adds misadjustment AM (Amplitude Modulation) and PM (Phase Modulation) noise that is passed directly to the antenna 230. This noise on the detector outputs increases the adjacent channel interference of the transmitter.

In the preferred embodiment, these DC offsets are correlated with the gain and phase misadjustment correction pulses. In accordance with the present invention, a DC correction block 214 uses this correlation to track and remove I and Q channel DC offsets. In the preferred embodiment, typical offsets of 20 mV at the signal point 225 are removed in approximately 10 ms.

The linear adapter 204 creates gain and phase correction pulses as the signal moves through all four quadrants of the IQ plane. DC offsets cause gain and phase biases in the correction for a given quadrant. Since diagonal quadrants have opposite gain and phase biases, the DC correction circuit 214 looks at diagonal quadrants to see if they are requesting opposite types of corrections. For example, if positive DC offsets exist on both I and Q, a four quadrant detector inside the DC adapter 214 will produce extra increase attenuation pulses when the signal is in quadrant 1 and extra decrease attenuation pulses in quadrant 3. The DC adapter 214 monitors this condition and incrementally applies negative voltages to compensate the I and Q error signal.

FIG. 5 summarizes the operation of the DC adjust algorithm. For normal DC operation, both I and Q thresholds are exceeded in opposite quadrants with opposite errors. It takes both conditions on one row of FIG. 5 before the correction pulses in column 1 are activated. Independent flip flops are used to look for each pair of events.

In the preferred embodiment, the corrections all run simultaneously. However, once one DC error has been driven to zero, the convergence for the other channel slows dramatically. To overcome this problem and in accordance with the present invention, when one DC error is driven to zero, that channel's thresholds are ignored.

In general, the DC adapter 214 removes DC offsets from the linear and nonlinear adapters 204 and 212. The linear adaptive algorithm creates gain and phase corrections pulses as the signal moves through all four quadrants in the IQ plane. DC offsets cause gain and phase biases in the corrections for a given quadrant. The DC correction circuit looks at diagonal quadrants to see if they are requesting opposite types of corrections. If so, FIG. 5 shows how to map combinations of gain & phase errors and input quadrant to the appropriate DC correction.

In summary, changes in the impedance of the antenna 230 as seen by the PA 228 are detected by the main loop 203. In response to these impedance changes the PA 228 through the main loop alters its own input accordingly. This altered input is detected by the AGC 208 which will recalibrate through the linear adapter 212. Then once again the non-linear adapter 204 can change the attenuator setting to make sure that the PA 228 is operating at the knee for optimum efficiency. The estimation algorithm is an adaptive approach. The transmitter input signal 219 is the reference for the adapter, and the error 225 signal from the transmitter main loop provides the adapter input. The magnitude detector 202 receives a sample of the transmitter input to detect three ranges: big, medium and small. The medium range is used as a time gate to adaptively correct for linear (small signal) gain and phase changes in the loop. The big range is used as a time gate to adaptively provide a specific amount of compression on the data peaks for enhanced efficiency. Both adapters 204 and 212 provide their corrections during the small window to reduce adjacent channel splatter.

What is claimed is:

1. A radio frequency (RF) amplifier, comprising:
   a main amplifier loop capable of stabilizing an amplifier without using an isolator, the main amplifier loop including:
      an attenuator;
      a loop filter coupled to the attenuator for providing a drive signal;
      a power amplifier for receiving and amplifying the drive signal;
   an auxiliary loop coupled to the main amplifier loop and receiving a sample of the drive signal, the auxiliary loop comprising:
      an Automatic Gain Control (AGC) for producing an AGC signal;
      a magnitude detector for detecting the magnitude of an input signal, the magnitude detector including a threshold detector for detecting at least three thresholds of the input signal;
      a linear adapter circuit for comparing the AGC signal to the input signal for providing a first error signal when a first input signal is present; and
      a non-linear adapter for comparing the AGC signal to the input signal for providing a second error signal when a second input signal is present.

2. The amplifier of claim 1, wherein the first input signal includes a medium input signal.

3. The amplifier of claim 1, wherein the second input signal includes a big input signal.

4. The amplifier of claim 1, wherein the at least three thresholds include a large input signal, a medium input signal, and a small input signal.

5. An integrated circuit for use in a linear isolator-eliminated transmitter, comprising:
   an amplifier feedback loop for linearly amplifying a signal, the amplifier feedback loop including a power amplifier;
   an auxiliary loop coupled to the amplifier feedback loop and including a linear gain control circuit;
   an attenuator for feeding the signal to the amplifier;
   a magnitude detector having a threshold detector for detecting when the signal is in an at least first second, or a third window;
   a linear adapter responsive to the first window to provide adjustment for the amplifier feedback loop and the linear gain control; and
   a non-linear adapter responsive to the second window to adjust the amplifier feedback loop to function with a predetermined amount of compression and to provide for the efficient operation of the power amplifier with minimum splatter without the use of an isolator.

6. The integrated circuit of claim 5, further including a phase adjust circuit for adjusting the phase of the signal in response to the linear adapter.

7. The integrated circuit of claim 5, further including a level adjust circuit for adjusting the attenuator setting.

8. The integrated circuit of claim 5, wherein the amplifier includes a closed loop amplifier.

9. The integrated circuit of claim 8, wherein the closed loop amplifier includes a Cartesian feedback loop amplifier.

10. The integrated circuit of claim 5, further including an Automatic Gain Control (AGC) coupled between the amplifier and the linear adapter.

11. A method for minimizing performance degradation of a linear transmitter in the presence of antenna interferences, comprising:

providing a signal path including an amplifier closed loop;

coupling a first sample from the signal path to an automatic gain control (AGC);

coupling a second sample from the signal path to establish a first and a second time window;

linearly adapting the amplifier closed loop to operate optimally in the first time window including adapting the amplifier closed loop during a third time window to provide for optimum operation during the first window; and directing the amplifier closed loop to operate with a predetermined amount of compression in the second time window.

12. A method for minimizing performance degradation of a linear transmitter in the presence of antenna interferences, comprising:

providing a signal path including an amplifier closed loop;

coupling a first sample from the signal path to an automatic gain control (AGC);

coupling a second sample from the signal path to establish a first and a second time window;

linearly adapting the amplifier closed loop to operate optimally in the first time window; and directing the amplifier closed loop to operate with a predetermined amount of compression in the second time window, including directing the amplifier colosed loop during a third time window to operate with a predetermined amount of compression in the second time window.

* * * * *